United States Patent [19]
Wojnarowski et al.

[11] Patent Number: 5,151,776
[45] Date of Patent: Sep. 29, 1992

[54] DIE ATTACHMENT METHOD FOR USE IN HIGH DENSITY INTERCONNECTED ASSEMBLIES

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 671,612

[22] Filed: Mar. 19, 1991

Related U.S. Application Data

[62] Division of Ser. No. 329,478, Mar. 28, 1989, Pat. No. 5,019,535.

[51] Int. Cl.5 .............................................. H01L 23/02
[52] U.S. Cl. ........................................ 357/81; 357/55; 357/68; 357/69; 357/80
[58] Field of Search ...................... 357/80, 55, 68, 69, 357/81

[56] References Cited
U.S. PATENT DOCUMENTS

| | | | |
|---|---|---|---|
| 4,698,662 | 10/1987 | Young et al. | 357/80 |
| 4,783,695 | 11/1988 | Eichelberger et al. | 357/65 |
| 4,937,660 | 6/1990 | Dietrich et al. | 357/80 |

*Primary Examiner*—Edward J. Wojciechowicz
*Attorney, Agent, or Firm*—Marvin Snyder; James C. Davis, Jr.

[57] ABSTRACT

A method for grounding or electrically biasing an integrated circuit chip without using a conductive die attach material comprises affixing the chips to a substrate using a thermoplastic polyimide adhesive. A metallization layer electrically connects the sides of the chips, which act as grounding surfaces, to a biased or grounded conductive layer on the substrate. The top surfaces of the integrated circuit chips which include the interconnection pads are protected against undesired metallization by a removable protective layer while the metallization layer is applied. Metal electroplated on the metallization layer serves the functions of a heat sink for the chip and a ground plane between chips.

18 Claims, 11 Drawing Sheets

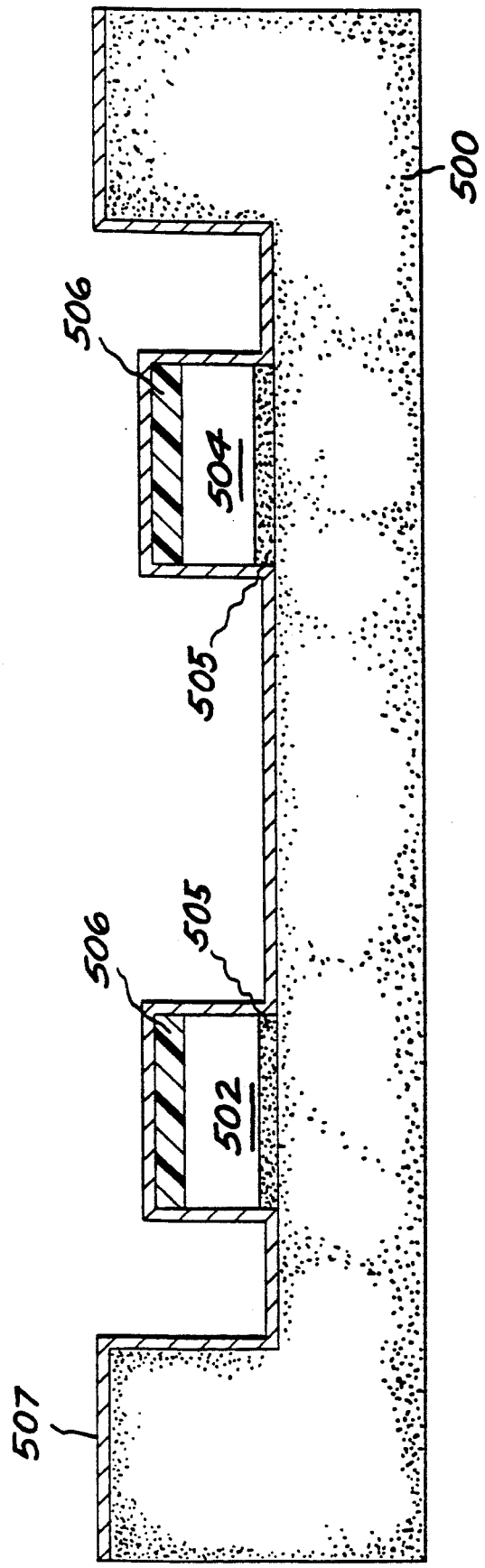

DIE ATTACHMENT METHOD FOR USE IN HIGH DENSITY INTERCONNECTED ASSEMBLIES

This invention was made with Government support under Contract No. F29601-86-C-0020 awarded by the Department of the Air Force. The Government has certain rights in this invention.

CROSS-REFERENCE TO RELATED APPLICATIONS

This is a division of application Ser. No. 329,478, filed Mar. 28, 1989, now U.S. Pat. No. 5,019,535, issued May 28, 1991.

This application is related to the following co-pending applications which are assigned to a common assignee and are incorporated herein by reference:

"An Adaptive Lithography System to Provide High Density Interconnect", Ser. No. 947,461, filed Dec. 29, 1986, now U.S. Pat. No. 4,835,704;

"High Density Interconnect with High Volumetric Efficiency", Ser. No. 250,010, filed Sep. 27, 1988, now U.S. Pat. No. 5,019,946; and "High Density Interconnect Thermoplastic Die Attach Material and Solvent Die Attach Processing", Ser. No. 312,798, filed Feb. 21, 1989, now abandoned in favor of continuation application Ser. No. 745,982, filed Aug. 5, 1991.

BACKGROUND OF THE PRIOR ART

1. Field of the Invention

This invention relates to a method of grounding integrated circuit chips and, more particularly, to a method of using a nonconductive die attach material to affix integrated circuit chips to a substrate and using a conductive layer adhered to the die attach material and dice sides to ground the chips.

2. Description of the Prior Art

Among the results of using conventional isolation methods in fabricating complementary metal oxide semiconductor (CMOS) devices is creation of parasitic MOS and parasitic bipolar devices that can be rendered conductive, or turned on, by ionizing radiation. Compensation for such parasitic devices must thus be provided in order to avoid spurious operation and consequential circuit failure. Latch-up may occur in some devices as a result of a parasitic silicon controlled rectifier (SCR) being turned on by gamma radiation. Single event upset (SEU) is caused by ionization occurring along the path of a single energetic particle passing through an integrated circuit. If the energetic particle generates the critical charge within the critical volume of a digital device, then logic upset occurs. The critical charge is the minimum amount of charge necessary to change the state of a logic or memory cell. The critical charge can be deposited by direct ionization from cosmic rays, alpha particles or secondary particles from nuclear reactions. Using a conductive die attach material to affix the base of a die to a grounded or biased surface is an effective method of biasing the bulk silicon in CMOS and other latch-up susceptible devices which are used in high intensity radiation environments.

While conductive die attach materials such as solder preforms and silver-containing epoxy resins can be used with little trouble on some dice, very large scale integrated circuits (VLSI), and especially VLSI dice that are tolerant to radiation, i.e., radiation hardened, are so complex and densely integrated that use of a conductive die attach material may pose unacceptable risks. Erroneous placement of conductive material on a VLSI die surface is likely to result in destruction of the die. In single die packages, correct placement of conductive material is not difficult to achieve; however, in multiple die packages, such as high density interconnect (HDI) packages deposition of conductive material at incorrect locations on the VLSI die surfaces is much more likely. HDI packages typically comprise a plurality of dice on a substrate which are interconnected by a metal interconnect pattern positioned on a polymer overlay layer laminated over the tops of the dice. The metal interconnect pattern can be formed by adaptive laser lithography as described in the above-referenced U.S. Pat. No. 4,835,704, allowing placement of integrated circuit chips (i.e., dice) closely adjacent one another.

Capillary action of the die attach material, while in its liquid state, tends to draw the chips together during the die attachment procedure and this tendency becomes more pronounced at elevated curing temperatures where viscosity of the die attach material is lower than at room temperatures. As the chips thus approach each other, or "swim together", under this capillary action, the conductive die attach material flows up over the tops of the dice by capillary attraction, resulting in short circuits between the conductors present on the sides of most VLSI chips and the pads present on the top surfaces of the respective chips. The shorting results in chip failure and, in general, VLSI chips having this problem are unrepairable.

High atomic number materials such as silver or gold cannot easily be used in mixtures with thermoplastic materials for die attach because the silver or gold flakes mixed with the thermoplastic materials spall in high intensity ionizing radiation environments and cause detachment of the dice. In addition, large dice cannot be attached directly by soldering or brazing since the thermal expansion coefficient mismatch between the solder or brazing alloy and both the silicon chip and the ceramic substrate introduces stresses that are so great that breakage may result. Yet silicon substrates are generally too fragile to carry large numbers of dice.

SUMMARY OF THE INVENTION

One object of this invention is to provide a die attachment method useful in high intensity ionizing radiation environments.

Another object is to provide a method for electrically connecting, to an electrically conductive layer on a substrate dice affixed to the conductive layer through a nonconductive resinous die attach material.

Another object is to provide a method for thermally cooling dice affixed to a conductive layer on a substrate through a resinous die attach material.

Another object is to provide a ground plane between a substrate and each of a plurality of dice affixed thereto.

In accordance with the invention, one or more dice are attached to a substrate having a conductive layer thereon. The dice are preferably radiation-hardened VLSI chips. The die attach material is nonconductive and may be a thermoplastic, such as Ultem ® 6000 polyetherimide, sold by General Electric Company, Pittsfield, Mass., or an epoxy resin such as Epo-Tech resin sold by Epoxy Technology, Inc. of Billerica, Mass. Any other suitable nonconductive die attach material may alternatively be used. The substrate is preferably comprised of alumina ceramic although substrates of other suitable materials, such as plastic, may alternatively be used. A conductive layer formed on the substrate is grounded or electrically biased. The active areas of the die tops are protected by tape, photoresist, a polyimide, or other suitable material. A thin metallization layer is applied over the dice and substrate by sputtering, dipping, electron beam evaporating, spraying, or other suitable process. The metallization preferably comprises a dual layer of titanium/copper or chromium/copper and is approximately 4000 angstroms (Å) thick, with 1000 Å thick layer of titanium or chromium applied first and a 3000 Å thick layer of copper applied thereover. (If direct laser ablation is to be utilized, however, the metallization layer will only be 1500 Å to 2000 Å thick with the titanium or chromium layer being approximately 1000 Å thick and the copper layer being 500–1000 Å thick). The titanium or chromium layer blocks intermetallic diffusion while promoting adhesion.

The invention contemplates building up an electroplated copper layer on the sides of the dice, on the sides of the die attach material, and on any conductive layer on the substrate, while protecting against formation of an electroplated layer over the tops of the dice and without exposing the active areas of the dice tops to metal. The plated metal electrically connects the VLSI chips to ground or to electrical bias, dissipates heat, and acts as a ground plane for adjacent chips. Several different methods of accomplishing these results are provided by the invention.

In a first method, the active areas of the die tops are protected with tape during application of the thin metallization layer. Thereafter, the tape may simply be peeled from the top of each die, removing with it the thin metallization layer thereon. A fresh piece of tape is then applied to replace the tape that has been removed, allowing electroplating to proceed without causing damage to the active areas on the die tops. Since no metallization layer is on the fresh piece of tape, no copper will be electroplated thereon. After electroplating is completed, removal of the tape yields the desired structure.

In a second method, the active areas of the die tops are protected by a resist layer during application of the thin metallization layer over the substrate, and the protected areas of the die tops are directly ablated, using laser energy, prior to the electroplating step. As discussed above, the thin metallization layer comprises a 1000 Å thick layer of titanium or chromium and 500–1000 Å thick layer of copper. The copper portion of the metallization layer absorbs about 70% of the laser energy in the 300–400 nanometer (nm) range and becomes very hot, allowing the dual metallization layer to be directly ablated by the laser. Thin layers of metal on poor thermal conductors such as photoresist and polyamide material may be flash-evaporated by exposure to laser energy since the poor thermal conductor dissipates little of the laser heat to which the thin metallization layer is subjected and the metallization layer is not thick enough to quickly conduct away any substantial heat from the site where the laser beam impinges. The laser beam is directed only at the die tops where the active areas have been protected by resist. Control of the laser beam can be effected by using the adaptive laser lithography system of U.S. Pat. No. 4,835,704 or by using standard masking and excimer laser techniques. After laser ablation, which leaves the resist to remain unaffected on the die top so as to protect the die surface, the remaining thin metallization layer which connects the die sides to a conductive layer on the substrate is built up by electroplating. After electroplating, the resist layer may be stripped away, using conventional methods, to yield the structure desired. This method works best on small dice where the side perimeter area of any die is equal to or greater than the area of the die bottom. The thick electroplated metal surrounding the sides of each die provides mechanical stability in holding the small dice to the substrate and enhances their cooling.

In a third method, a layer comprised of a negative resist, such as Fanton F360 resist, sold by Armstrong World Industries of Lancaster, Pa. is deposited over the top of the thin metallization layer which has been applied as described for the first and second methods. On development, negative resists remain where they are exposed, but all unexposed areas are removed. The negative resist layer may be exposed by conventional masking techniques, but the preferred method of exposure is by using the adaptive laser lithography system of the above-referenced U.S. Pat. No. 4,835,704. Because of inexactness in die placement, creating a mask representative of the die positions is difficult; however, in using the adaptive laser lithography system a computer keeps track of the exact die positions and generates artwork which represents those positions. The laser scans only the protected die top areas to properly expose the negative resist layer. After the exposing step, the resist is developed, effectively leaving a second resist layer above the protected die top active areas. The exposed thin metallization layer is then electroplated as discussed above. The negative resist layer, which prevents the build-up of copper over the active areas on the die tops during electroplating, is then removed. If Fanton F360 resist is employed as the negative resist, it may be selectively removed by stripping with Parson's Wax and Acrylic Remover with Ammonia, sold by the Armour-Dial Inc. of Phoenix, Ariz. The copper is then differentially etched with ferric chloride, leaving thick electroplated copper on the die sides which extends to a grounded or electrically biased conductive layer on the substrate, and a thin titanium or chromium layer (assuming titanium/copper or chromium/copper is used as the thin metallization layer) positioned on the resist layer portions covering the die top areas. The titanium is then removed, as by etching with a 25 percent fluoroboric acid solution, or the chromium is removed as by etching with a solution comprised of 25 grams of ciric sulfate dissolved in 150 milliliters of nitric acid diluted with one liter of deionized water, or by using a conventional, commercially-available chromium stripper. After removal of the thin titanium or chromium layer, the resist which remains over the active die areas is removed by using appropriate strippers. This results in perfectly-patterned copper from the ground or voltage plane up the die sides with the active die areas being undamaged.

In a fourth method, a palladium chloride solution is applied to a properly-prepared die on which the active areas have first been coated with a protective photoresist. The palladium chloride solution on the die is dried and then removed from the photoresist surface, as by ablation with an ultraviolet (UV) scanning laser by scanning the laser beam over the entire top surface of the die, or by ablation with an excimer laser illuminating the photoresist surface through an appropriate mask. Immersion in standard electroless plating solution converts the palladium chloride to palladium and gaseous chlorine so that the elemental palladium can then act as a catalyst to precipitate copper from the plating solution wherever the palladium is present. The copper layer is further thickened by electroplating. The photoresist is then stripped off the die tops by conventional resist stripping techniques to yield a functional die electrically grounded to the substrate.

BRIEF DESCRIPTION OF THE DRAWINGS

The foregoing and other objects, aspects and advantages of the invention will be better understood from the following detailed description of the invention with reference to the drawings, in which:

FIGS. 8a–8c are progressive cross-sectional side views of a substrate undergoing masking, plating and etching procedures which result in partitioning of two chips mounted on the substrate such that one chip will be connected to ground and the other chip will be connected to a bias voltage.

DETAILED DESCRIPTION OF THE PREFERRED EMBODIMENTS OF THE INVENTION

Figure 1:
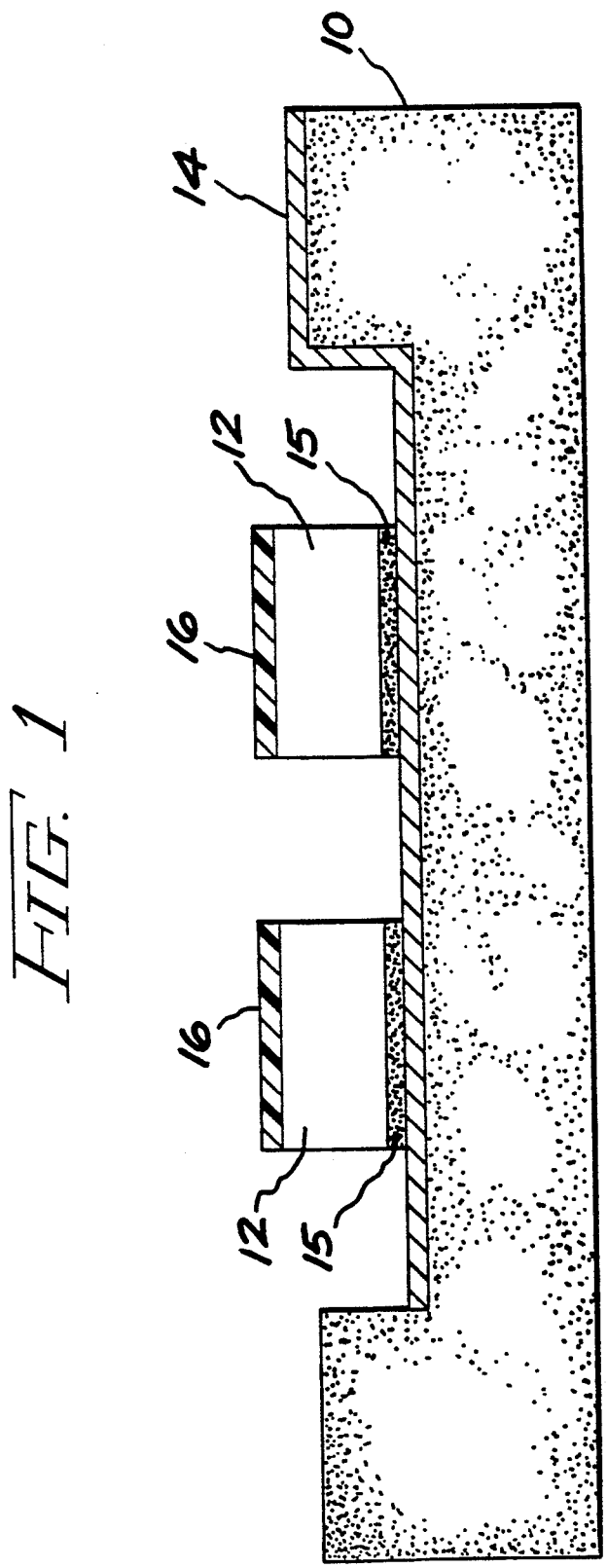
FIG. 1 is a cross-sectional side view of a substrate having a plurality of chips attached thereto, with each of the chips having its top surf protected.

FIG. 1 shows a substrate 10 having a plurality of integrated circuit chips 12 affixed thereto. Chips 12 are preferably VLSI radiation hardened chips and may be 240 mils square and 22 mils thick. Substrate 10 may comprise alumina, plastic, or other suitable material. A conductive layer 14 may be situated on substrate 10 beneath chips 12. Chips 12 are affixed to substrate 10 by a nonconductive adhesive 15. The adhesive may be Ultem 6000 resin, Epo-Tech resin, or any other suitable nonconductive die attach material. The amount of die attach material 15 used for securing the dice should be chosen such that it does not completely cover conductive layer 14. The amount of die attach material 15 that may ooze out from under the dice during high-temperature curing should be considered when determining the amount to apply to the die bottom.

A protective layer 16 covers the active areas of the die 12 tops, including interconnect pads and circuitry, and protects these areas from metallization which, if misapplied thereto, would ruin chips 12. Protective layer 16 may comprise a suitable tape, a pre-reacted polyimide material such as Ultem 6000 or SPI 129 silicone polyimide sold by General Electric Company Microelectronic Materials of Phoenix, Ariz., photoresist, or other suitable material.

Figure 2:
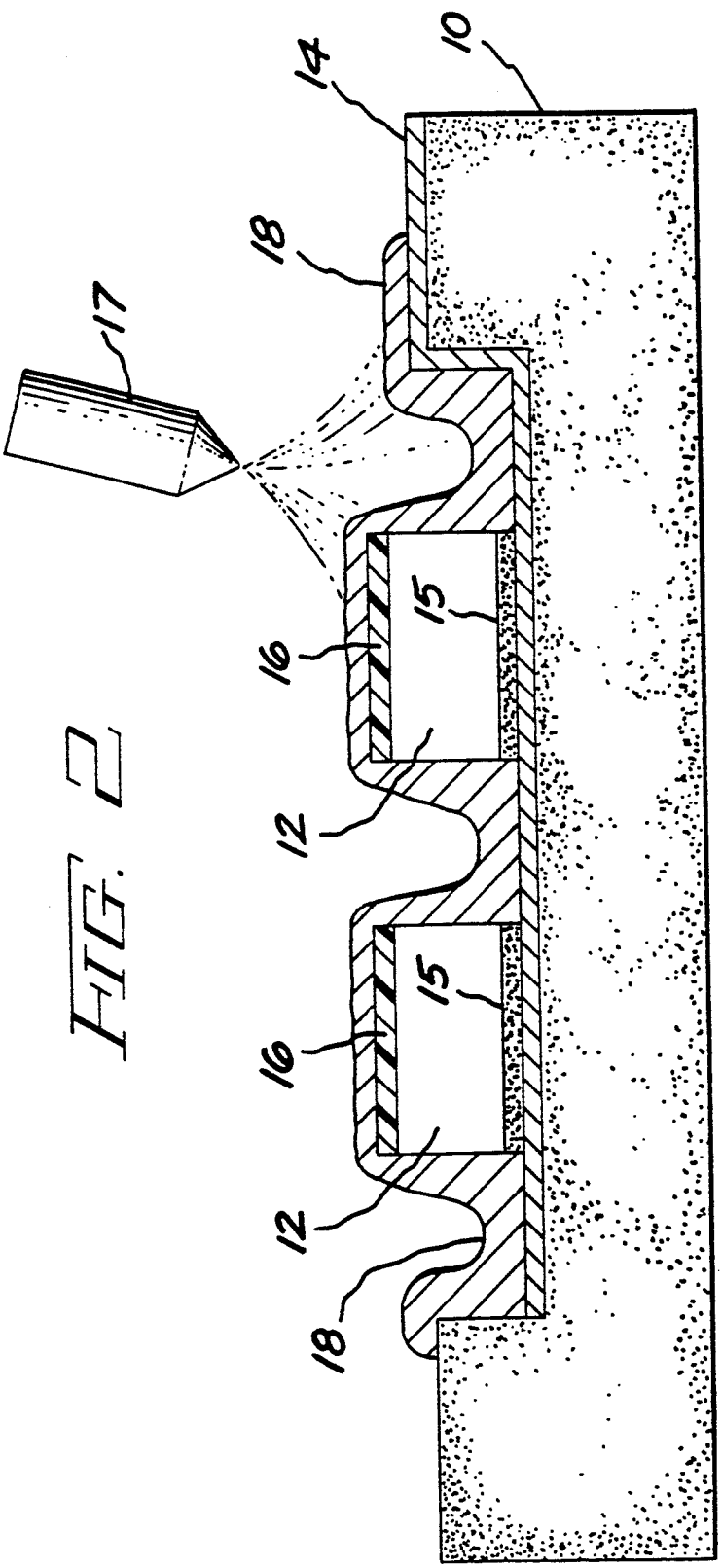
FIG. 2 is a cross-sectional side view of the substrate shown in FIG. 1 after metallization has been applied to the chips.

FIG. 2 illustrates use of an applicator 17 to deposit metallization 18 over chips 12, as by sputtering, spraying, dipping or other suitable procedure. Metallization 18 may be a dual layer comprised of titanium/copper or chromium/copper or a single layer comprised of titanium, chromium or copper. Preferably, metallization 18 is comprised of a 1000 Å thick layer of titanium or chromium overlaid with a 3000 Å thick layer of copper. A layer of titanium or chromium blocks intermetal diffusion and promotes adhesion. Metallization 18 bridges over adhesive 15 to conductive layer 14 on substrate 10, and can be built up by electroplating with copper.

Figure 3:
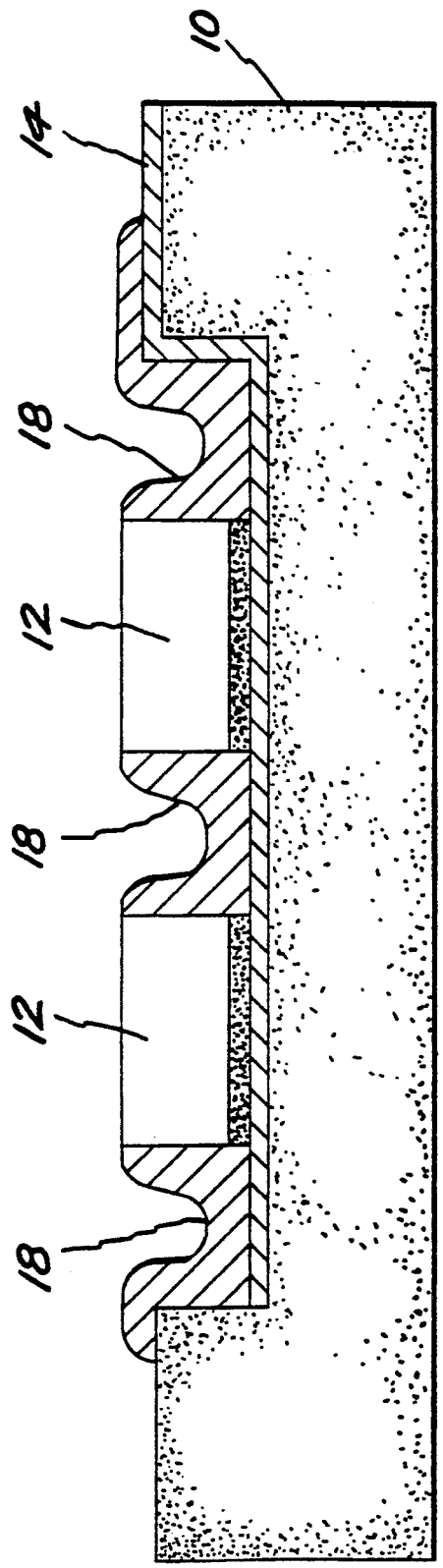
FIG. 3 is a cross-sectional side view of the substrate shown in FIG. 2 showing the applied metallization grounding each of the chips to a conductive layer on the substrate.

FIG. 3 illustrates chips 12 after protective layer 16, shown in FIGS. 1 and 2, has been removed from chips 12, at which time metallization 18 provides an electrical connection from each side of chips 12 to conductive layer 14 which is to be connected to ground or a bias voltage source (not shown). If gold-backed dice 12 are used, grounding is accomplished directly to the gold on the backs of the dice. Metallization 18 provides electrical grounding (or bias) and a heat dissipation path for chips 12 and acts as a ground plane between the chips. It will be recognized that conductive layer 14 is not essential to the structure of the invention since metallization 18 can be so formed that a connection to ground or voltage bias can be made directly to metallization layer 18 after completion of its electroplating; however, conductive layer 14 is illustrated in the drawings since most commercially-available substrates are sold with such metal layer already formed on the substrate. Creation of the structure shown in FIG. 3 is therefore a focus of this invention and may be achieved by any one of several methods.

Figure 4A:
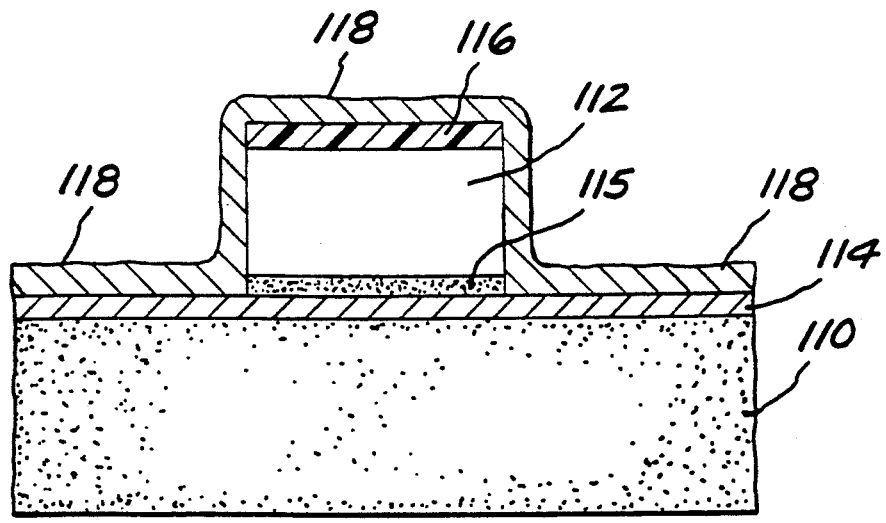
FIGS. 4a through 4c are progressive cross-sectional side views of a chip on a substrate being processed according to a first method of the present invention.
Figure 4B:
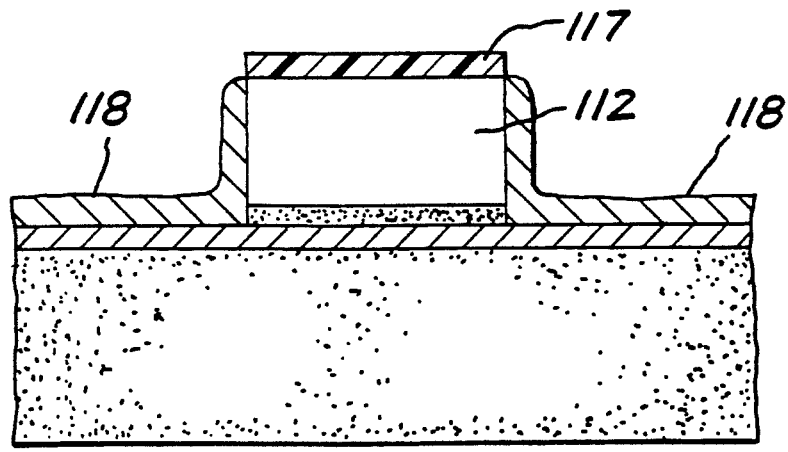
Figure 4C:
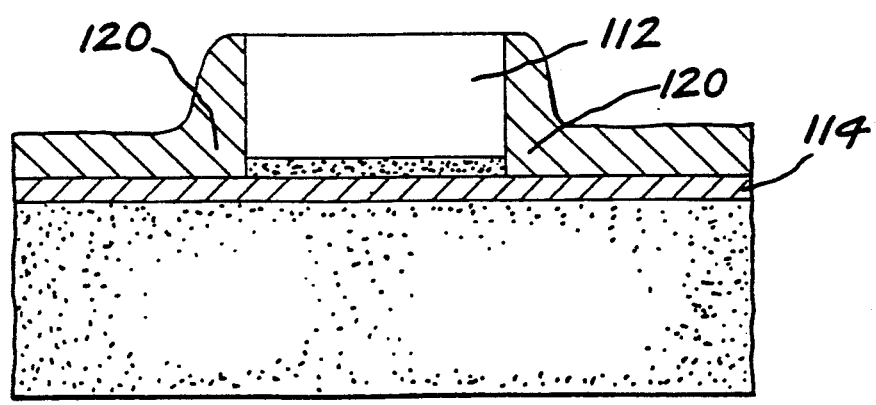

FIGS. 4a–4c illustrate a first method of implementing the invention wherein a tape protection procedure is used. FIG. 4a shows a chip 112 affixed to a substrate 110 by an adhesive 115. The active area of the die 112 top is protected by tape 116. Tape 116 may be comprised of adhesive-backed Kapton polyimide film, available from Permacil, an Avery International Company, New Bruswick, N.J. or other suitable tape material. A metallization layer 118 is sputtered over die 112 and substrate 110 at a power of 400 watts, to a total thickness of 4000 Å and, as a dual layer, may comprise a 1000 Å thickness of titanium or chromium overlaid with a 3000 Å thickness of copper. Metallization layer 118 electrically connects the sides of die 112 to conductive layer 114 formed on substrate 110.

FIG. 4b shows chip 112 from which tape 116, shown in FIG. 4a, has been removed and replaced by a clean piece of tape 117. Removal of tape 116 lifts off all of metallization 118 that had been sputtered over the top of die 112.

FIG. 4c shows chip 112 with metallization layer 118 built up to a thick copper side plating layer 120 by electroplating with copper for 10 minutes at a current level of 6 amps on a 6 inch by 6 inch cathode area, yielding approximately a 1 mil thickness of copper everywhere except on the active areas of the die 112 top. Subsequent removal of tape 117, shown in FIG. 4b, yields a structure of configuration shown in FIG. 3. Although a 0.7 mil aluminum wire connecting die 112 to conductive layer 114 would be sufficient to properly bias die 112, side plating 120 is clearly superior since it also enhances cooling of the chip by acting as a heat sink. Moreover, the metallization between adjacent ones of a plurality of chips serves as a ground plane that prevents closely-spaced chips from interacting unintentionally. Conductive layer 114 is connected to ground or a bias voltage source (not shown) for the purpose of using the resulting device in a high intensity ionizing radiation environment.

Figure 5A:
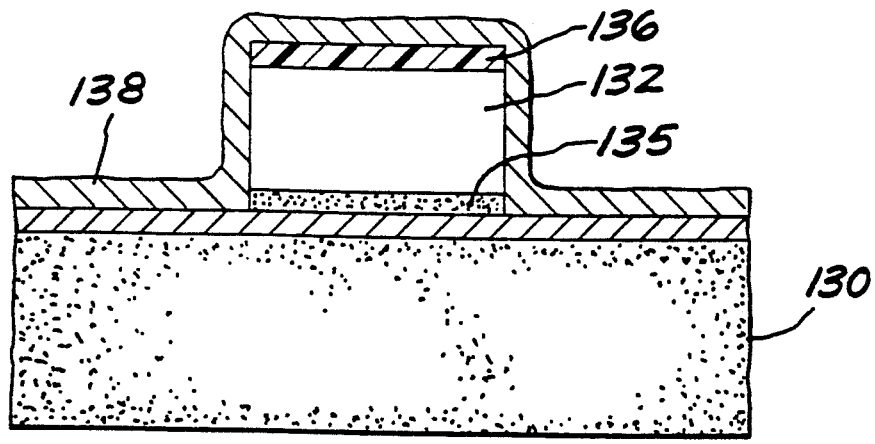
FIGS. 5a through 5c are progressive cross-sectional side views of a chip on a substrate being processed according to a second method of the present invention.
Figure 5B:
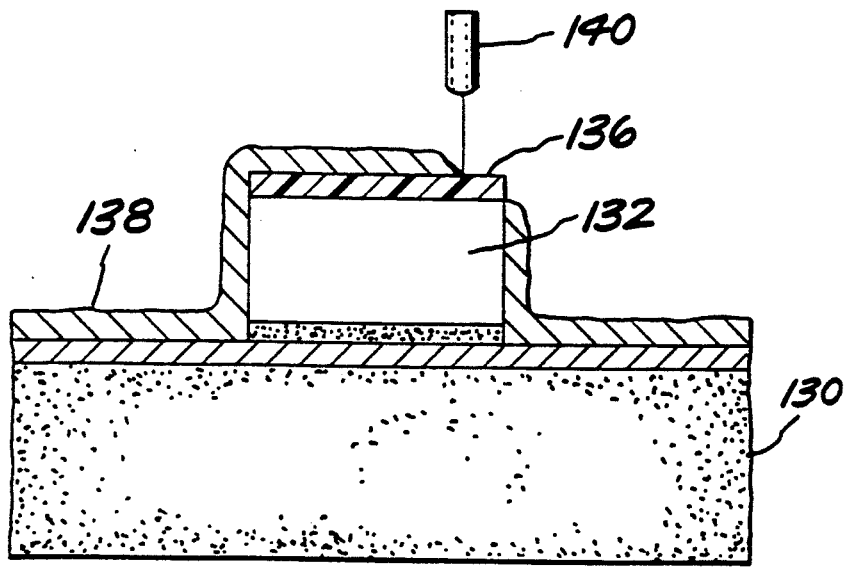
Figure 5C:
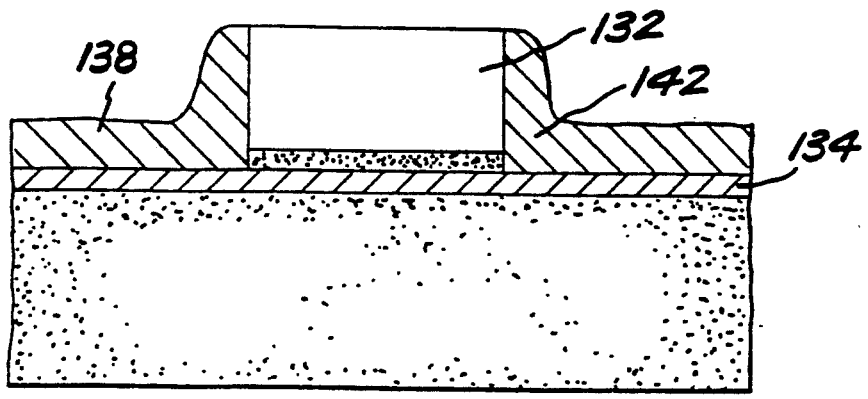

FIGS. 5a-5c illustrate a second method of implementing the invention wherein metal coated over the die tops is ablated with a laser before electroplating. FIG. 5a shows a chip 132 affixed to a substrate 130 by an adhesive 135 according to the procedures described above. The active area of the chip 132 top is overcoated with a resist layer 136, preferably comprising a 1 to 3 microns thickness of photoresist or a 3 to 5 microns thickness of polyimide. Other suitable resists which may be stripped by standard chemical or plasma techniques may alternatively be used. Resist layer 136 may be deposited by a precision dispenser on the top of each chip 132 on substrate 130. Alternatively, resist layer 136 may be deposited by spraying photoresist over the entire substrate 130, exposing the active areas of the die 132 tops, and stripping off the excess photoresist. A thin metallization layer 138, preferably 1500-2000 Å thick, is applied over substrate 130 and is preferably comprised of a 1000 Å thick layer of titanium or chromium, overcoated by a 500-1000 Å thick layer of copper.

FIG. 5b shows the portion of metallization layer 138 coated over resist layer 136 being flash evaporated by exposure to laser energy. Laser source 140 is preferably a computer-controlled argon ion laser as described in the above-referenced co-pending application Ser. No. 947,461. The laser operates at 351 nm and ½ to 2 watts focussed down to a 6 microns diameter spot. The adaptive lithography system stores the precise location of each chip 132 placed on substrate 130 and uses this information to scan the laser beam only over the locations where ablation is required. An oxygen-enriched ambient has been found to enhance the laser ablation. If laser source 140 alternatively comprises an excimer laser, proper masking is required in order to expose only the portion of metallization layer 138 coated over the die 132 tops. Either of the above mentioned laser sources 140, when properly used in the ultraviolet region, will directly ablate thin metallization layer 138 positioned on a thermally inefficient surface such as photoresist, since the copper overlayer portion of metallization layer 138 will absorb about 70% of the laser energy at 300-400 nm wavelength. After ablation of metallization layer 138, resist layer 136 remains over the die 132 active areas for protection during the electroplating operation.

FIG. 5c shows that metallization layer 138 built up, through electroplating, forms a thick side-plated layer 142 which electrically connects chip 132 to a conductive layer 134 on the substrate surface. Because metallization layer 138 has been completely removed from resist layer 136 (shown in FIG. 5b) by flash evaporation, no copper is plated over the top of die 132. Resist layer 136 itself has been removed from the top of die 132 through conventional stripping techniques or known laser ablation techniques. This method of practicing the invention is best for small dice 132 where the side perimeter area is equal to or greater than the dice 132 bottom area. The thick side-plated layer 142 provides additional mechanical stability to small dice and enhanced cooling.

Figure 6A:
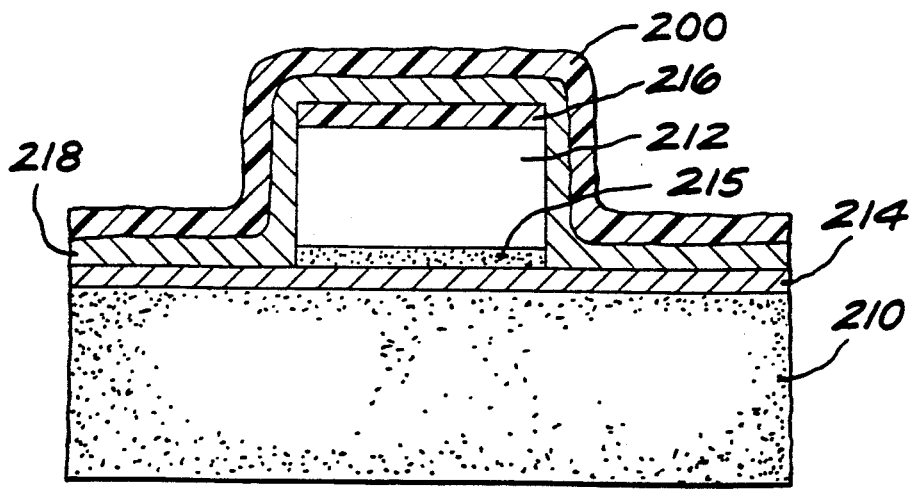
FIGS. 6a through 6f are progressive cross-sectional side views of a chip on a substrate being processed according to a third method of the present invention.
Figure 6B:
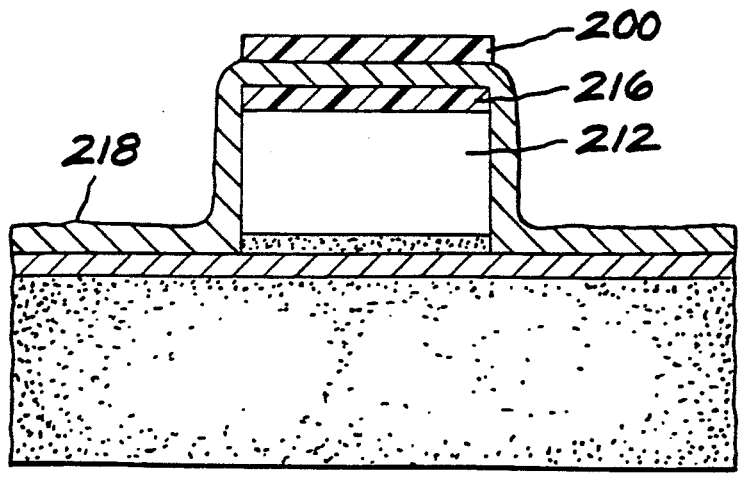
Figure 6C:
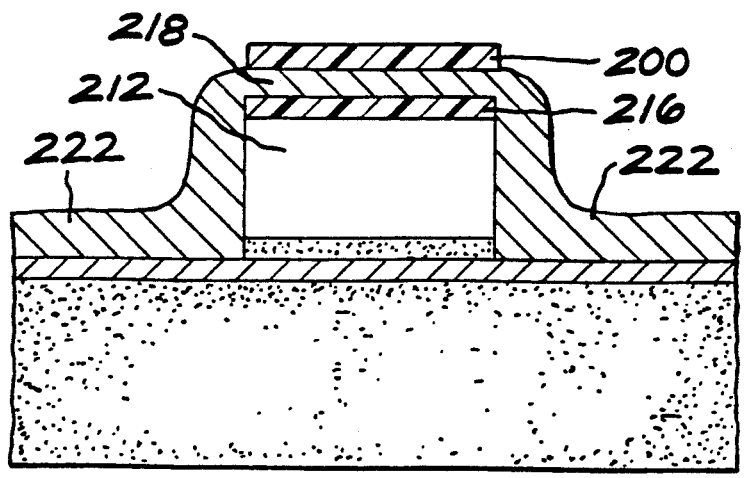

FIGS. 6a-6f illustrate a third method of implementing the invention utilizing a negative resist layer 200. FIG. 6a shows a chip 212 affixed to a substrate 210 by an adhesive 215 according to the procedures described above. A first resist layer 216, which may be a photoresist, covers the active areas of the die 212 top and is applied according to the procedures described above. A thin layer of titanium/copper or chromium/copper metallization 218 is coated over substrate 210 by sputtering or other suitable method. Metallization 218 preferably comprises a coat of titanium or chromium approximately 1000 Å thick supporting thereon a coat of copper approximately 3000 Å thick. A negative resist, layer 200, such as Fanton F360 resist, is applied over the top of thin metallization layer 218. Negative resist layer 200 may be exposed by conventional masking techniques, but the preferred method of exposure is by using the adaptive laser lithography system of the above-referenced U.S. Pat. No. 4,835,704. The system employs a computer (not shown) which directs the laser to scan only the protected die 212 tops. After development, negative resist layer 200 covers only the portion of metallization 218 that is coated over die 212, as shown in FIG. 6b. The exposed metallization layer 218 is built up by electroplating, as discussed above, to form thick copper side plating 222 shown in FIG. 6c, while negative resist layer 200 prevents build-up of copper over the active areas on the die 212 tops during electroplating.

Figure 6D:
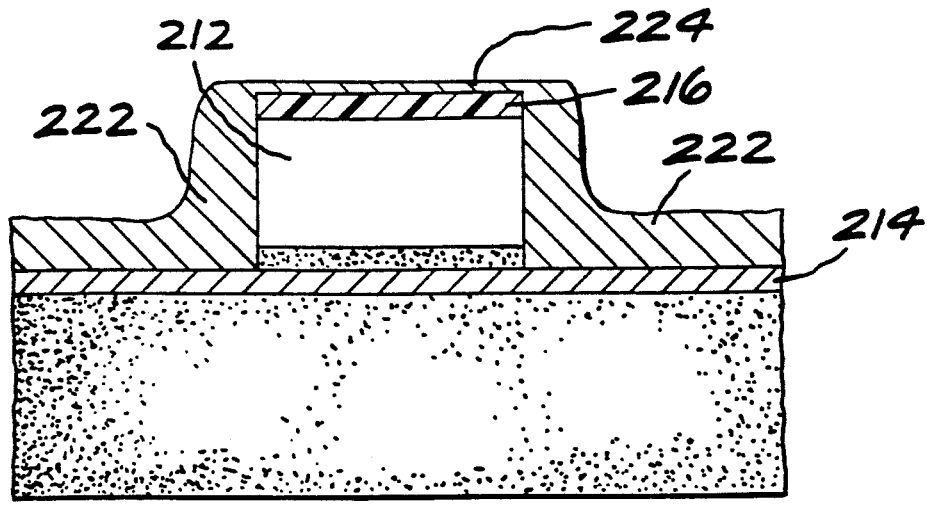
Figure 6E:
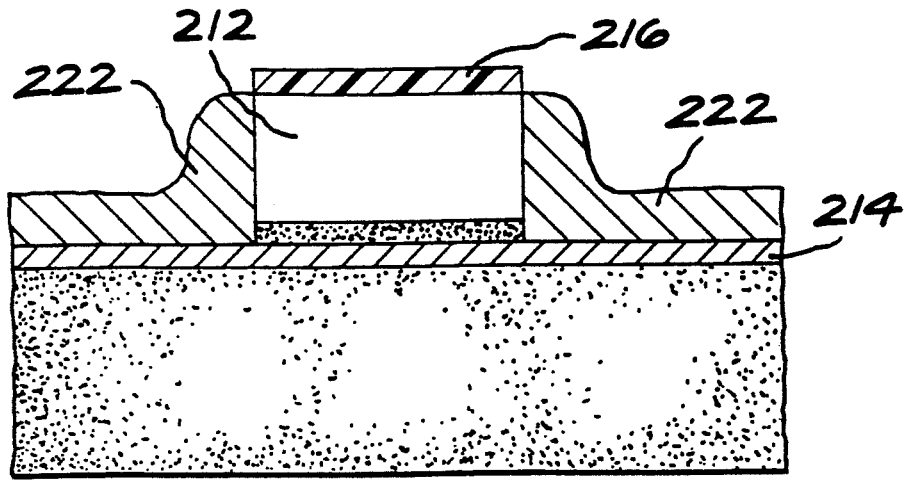
Figure 6F:
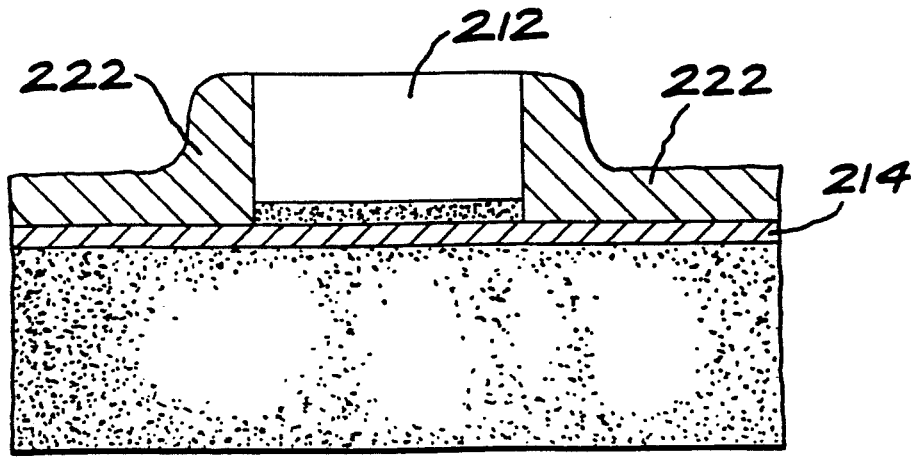

After the electroplating procedure, negative resist layer 200 is selectively removed by etching with a suitable stripper. For example, Fanton F360 resist can be removed using Parsons Wax and Acrylic Remover with Ammonia. Differential etching of the copper using ferric chloride removes but a very small fraction of thick copper side plating 222 connecting the sides of die 212 to a biased or grounded conductive layer 214 on the substrate but removes the entire thin nonelectroplated copper overlayer portion of dual metallization layer 218 to leave a thin titanium or chromium layer 224 positioned on resist layer 216, as shown in FIG. 6d. Layer 224 is next selectively removed from the top of die 212, leaving the structure shown in FIG. 6e. Titanium removal is accomplished by etching with a 25% fluoroboric acid solution, while chromium removal may be accomplished by etching with the ciric sulfate solution described above or by plasma etching in 80% oxygen and 20% CF$_4$ at 150 watts in a barrel etcher. Resist layer 216 is then removed with appropriate strippers, such as Parsons Wax and Acrylic Remover with Ammonia, to removes photoresist, or by laser ablation, which removes polyimide coatings, leaving the structure shown in FIG. 6f. This procedure produces perfectly patterned copper from the ground or voltage plane (i.e., conductive layer 214) onto the entire height of the sides of die 212, leaving the active die areas undamaged.

Figure 7A:
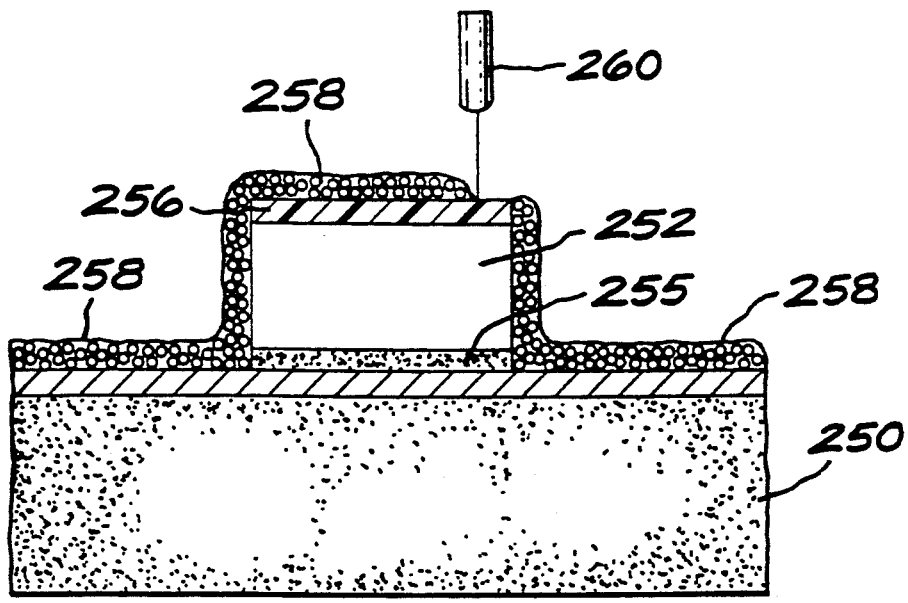
FIGS. 7a through 7c are progressive cross-sectional side views of a chip on a substrate being processed according to a fourth method of the present invention.
Figure 7B:
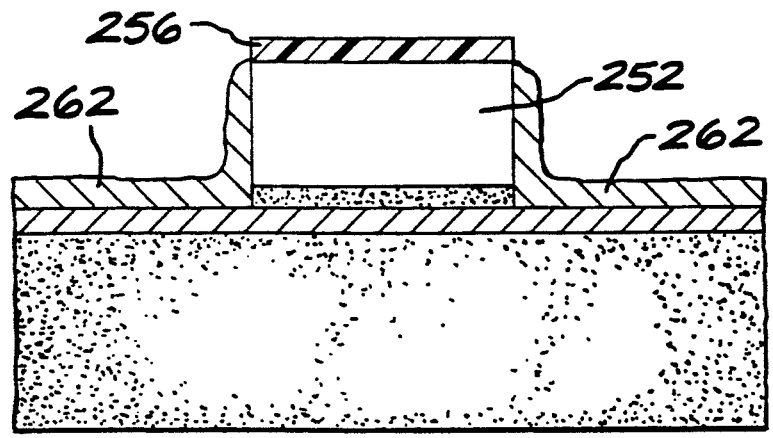
Figure 7C:
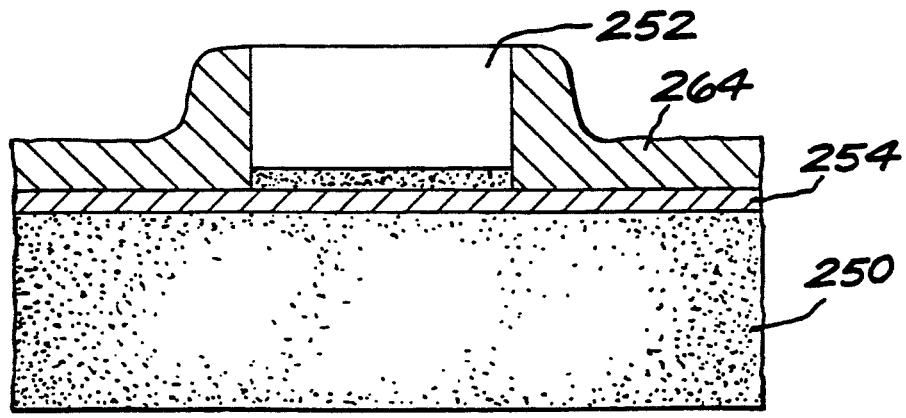

FIGS. 7a-7c illustrate a fourth method of implementing the invention wherein electroless plating is utilized. As shown in FIG. 7a, a chip 252 protected by a resist layer 256 is affixed to a substrate 250 using an adhesive 255 as described above. A palladium chloride preparation 258 of the type utilized in standard semi-additive plating in printed circuit board manufacturing, such as Cataprep 44 sold by Shipley Corp., Newton, Mass., is applied over chip 252 and substrate 250 by spraying or dipping. After palladium chloride layer 258 is dried, the layer, if derived from Cataprep 44, which is a tin-palladium colloid, is sensitized by applying thereto the accelerator designated by Shipley to strip out the tin (which is used to stabilize the colloid). Thereafter, the chip is washed, and subsequently the portion of layer 258 coated over the top of chip 252 is destroyed using an ultraviolet scanning laser 260 operating at 350 nm wavelength. The adaptive laser lithography system disclosed in the above-referenced U.S. Pat. No. 4,835,704 can be used to selectively scan the entire top surface of each die 252 on substrate 250. An excimer laser may be substituted for scanning laser 260 if appropriately-framed masks are employed. Palladium chloride layer 258 is next subjected to a standard electroless plating process whereby the palladium chloride is converted to elemental palladium and gaseous chlorine, with precipitation of copper 262 onto substrate 250 and the sides of chip 252, resulting in the structure shown in FIG. 7b. Unlike sputtering, for example, this procedure requires no vacuum step since copper is deposited only where there is a catalyst (i.e., palladium). Removal of resist layer 256 with appropriate strippers results in the structure shown in FIG. 7c. The thickness of copper 262 is then enhanced by electroplating to form thickened side plating 264, as shown in FIG. 7c.

To increase heat removal during performance of any of the four methods described above, an electrically-insulating alumina-packed paste may first be applied to the bottom of the die. A braze attach instead of adhesive also increases thermal cooling of the die. The electroplated copper on the sides of the die not only provides an electrical connection to the grounded or biased conductive layer on the substrate, but also provides additional heat-sinking to the substrate. If desired, a larger thickness of copper can be plated to the sides of the die to increase heat removal still further. Voltages applied to the die substrate in apparatus fabricated by any of the four above-described methods typically range from −15 volts to +15 volts, and preferably are in the range of −5 volts to +5 volts.

Figure 8B:
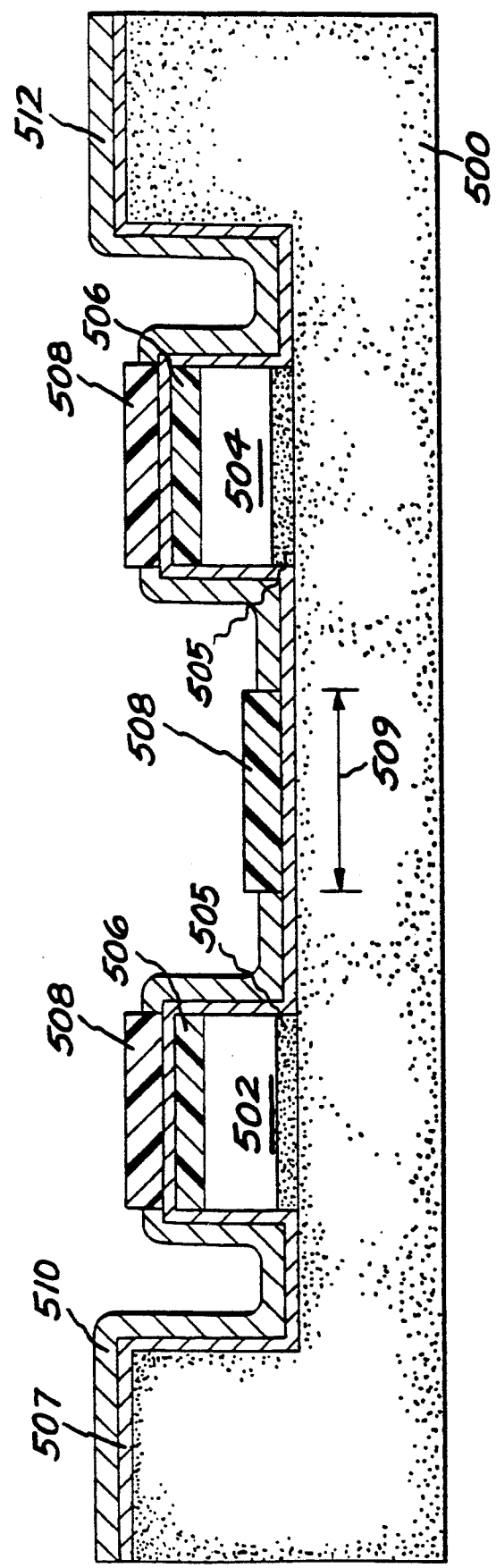
Figure 8C:
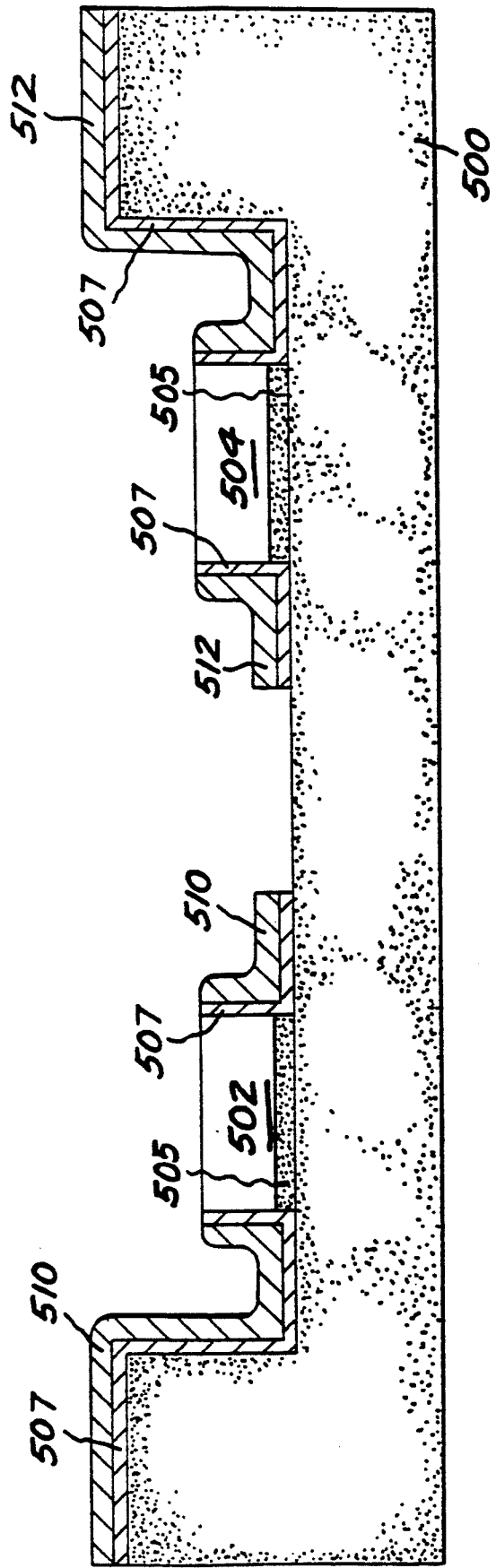

FIGS. 8a, 8b and 8c illustrate a masking, plating and etching procedure used when ground and/or voltage bias are different on different dice, such as dice 502 and 504, positioned on the same substrate 500, and affixed to the substrate 500 by nonconductive adhesive 505, as shown in FIG. 8a. A first resist layer 506 is deposited on the die tops to protect the active areas. Then the entire substrate 500 surface is coated with a thin layer of metallization 507, preferably of titanium/copper and applied by sputtering a layer of titanium approximately 1000 Å thick followed by a layer of copper approximately 3000 Å thick, resulting in the structure shown in FIG. 8a. Other suitable metals may be substituted for this thin layer of metallization. A second resist 508 is then applied in between the dice at region 509 and over the die tops. Resist 508 may be a negative photoresist which is sprayed over the entire surface of substrate 500, exposed only at location 509 and on the top of the chips 502 and 504, and developed so that only the exposed areas remain. Alternatively, resist 508 may be a positive photoresist which is sprayed over the entire surface of the substrate, followed by masking of location 509 and the tops of dice 502 and 504, exposing the surface to collimated light energy, and developing the photoresist. The surface of the substrate is then electroplated as described above to form side plated layers 510 and 512 as shown in FIG. 8b. Electroplating occurs only in regions that are not covered by resist material, so that layers 510 and 512 are physically separated from each other at region 509. The thickness of side plated layers 510 and 512 is dependent on electrical current and cooling requirements of the circuit being produced. Following electroplating, first and second resist layers 506 and 508, respectively, are removed using standard stripping procedures. The portions of thin layer of metallization 509 situated where second resist layer 508 has been removed, may be removed by differential etching for copper using ferric chloride, followed by removal of the titanium by etching with fluoroboric acid. Side plated layer 510 may then be connected to ground or a bias voltage source (not shown) and side plated layer 512 may be connected to ground or a bias voltage source (not shown) independent of the voltage on side plated layer 510.

The foregoing describes a die attachment method for use in high density interconnected assemblies employable in high intensity ionizing radiation environments where dice affixed to an electrically conductive layer on a substrate through a nonconductive resinous die attach material are electrically connected to the substrate and efficiently cooled. The conductive layer can be used as a ground plane between the substrate and the dice.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An interconnect system for an integrated circuit chip mounted on a substrate, said chip having an active surface, a mounting surface opposite said active surface, and side surfaces extending between said active and mounting surfaces, said system comprising:
   a conductive layer on said substrate adapted to be maintained at a predetermined voltage level;
   a nonconductive adhesive material affixing said mounting surface of said integrated circuit chip to said conductive layer, said nonconductive adhesive material not entirely covering said conductive layer; and
   a layer of metallization electrically connecting said side surfaces of said integrated circuit chip to said conductive layer, said layer of metallization being sufficiently thick to provide thermal cooling for said integrated circuit chip over substantially the entire thickness of said chip.

2. The integrated circuit chip of claim 1 wherein said nonconductive adhesive material comprises alumina-packed paste positioned on said mounting surface of said integrated circuit chip to enhance heat dissipation from said integrated circuit chip.

3. An electrical component, comprising:
   a substrate;
   first and second integrated circuit chips, each of said chips having an active surface, a mounting surface opposite said active surface, and side surfaces extending between said active and mounting surfaces;
   a nonconductive adhesive affixing said mounting surfaces of said integrated circuit chips to said substrate;
   a first voltage bias plane electrically connected to said first integrated circuit chip, said first voltage bias plane comprising a first layer of metallization in electrical contact with said side surfaces of said first integrated circuit chip and extending over exposed portions of said nonconductive adhesive affixed thereto; and a second voltage bias plane electrically connected to said second integrated circuit chip, said second voltage bias plane comprising a second layer of metallization in electrical contact with said side surfaces of said second integrated circuit chip and extending over exposed portions of said nonconductive adhesive affixed thereto, said second voltage bias plane being electrically isolated from said first voltage bias plane;

said layers of metallization being sufficiently thick to provide thermal cooling for said integrated circuit chips over substantially the entire thickness of said chips.

4. The electrical component of claim 3 wherein said first voltage bias plane comprises a ground plane.

5. An interconnect system in accordance with claim 1 wherein said layer of metallization comprises a titanium/copper dual layer.

6. An interconnect system in accordance with claim 5 wherein said layer of metallization comprises a 1000 Angstrom thick layer of titanium over laid with a 3000 Angstrom thick layer of copper.

7. An interconnect system in accordance with claim 1 wherein said layer of metallization comprises a chromium/copper dual layer.

8. An interconnect system in accordance with claim 7 wherein said layer of metallization comprises a 1000 Angstrom thick layer of chromium overlaid with a 3000 Angstrom thick layer of copper.

9. An interconnect system for an integrated circuit chip mounted on a substrate, said chip having an active surface, a mounting surface opposite said active surface, and side surfaces extending between said active and mounting surfaces, said system comprising:

a nonconductive adhesive material fixing said mounting surface of said integrated circuit chip to said substrate; and a layer of metallization electrically connected to said side surfaces of said integrated circuit chip and adapted to be maintained at a predetermined voltage level, said layer of metallization being sufficiently thick to provide thermal cooling for said integrated circuit chip over substantially the entire thickness of said chip.

10. An interconnect system in accordance with claim 9 wherein said layer of metallization comprises a titanium/copper dual layer.

11. An interconnect system in accordance with claim 10 wherein said layer of metallization comprises a 1000 Angstrom thick layer of titanium overlaid with a 3000 Angstrom thick layer of copper.

12. An interconnect system in accordance with claim 9 wherein said layer of metallization comprises a chromium/copper dual layer.

13. An interconnect system in accordance with claim 12 wherein said layer of metallization comprises a 1000 Angstrom thick layer of chromium overlaid with a 3000 Angstrom thick layer of copper.

14. The electrical component of claim 3 wherein said nonconductive adhesive comprises alumina-packed paste positioned on said mounting surfaces of said integrated circuit chips to enhance heat dissipation from said integrated circuit chips.

15. An interconnect system in accordance with claim 3 wherein said layers of metallization each comprise a titanium/copper dual layer.

16. An interconnect system in accordance with claim 15 wherein said layers of metallization each comprise a 1000 Angstrom thick layer of titanium overlaid with a 3000 Angstrom thick layer of copper.

17. An interconnect system in accordance with claim 3 wherein said layers of metallization each comprise a titanium/copper dual layer.

18. An interconnect system in accordance with claim 17 wherein said layers of metallization each comprise a 1000 Angstrom thick layer of titanium overlaid with a 3000 Angstrom thick layer of copper.

* * * * *